(12) United States Patent  
Couture et al.

(10) Patent No.: US 9,285,489 B2  
(45) Date of Patent: Mar. 15, 2016

(54) ORGANIC X-RAY DETECTOR ASSEMBLY AND METHOD OF MANUFACTURING SAME

(71) Applicant: General Electric Company, Schenectady, NY (US)

(72) Inventors: Aaron Judy Couture, Schenectady, NY (US); Marc Schaepkens, Clifton Park, NY (US); Abdelaziz Ikhlef, Hartland, WI (US)

(73) Assignee: General Electric Company, Schenectady, NY (US)

( * ) Notice: Subject to any disclaimer, the term of this patent is extended or adjusted under 35 U.S.C. 154(b) by 96 days.

(21) Appl. No.: 14/014,003

(22) Filed: Aug. 29, 2013

(65) Prior Publication Data

US 2015/0060676 A1    Mar. 5, 2015

(51) Int. Cl.  
*G01T 1/20* (2006.01)

(52) U.S. Cl.  
CPC ............... *G01T 1/2018* (2013.01); *G01T 1/20* (2013.01); *Y10T 29/49155* (2015.01)

(58) Field of Classification Search  
CPC .............................. G01T 1/2018; G01T 1/20  
See application file for complete search history.

(56) References Cited

U.S. PATENT DOCUMENTS

| | | | |
|---|---|---|---|
| 6,426,991 B1 | 7/2002 | Mattson et al. | |
| 7,148,486 B2 | 12/2006 | Heismann et al. | |
| 7,180,075 B2 | 2/2007 | Brabec et al. | |
| 7,379,528 B2 | 5/2008 | Mattson et al. | |
| 7,838,994 B2 | 11/2010 | Shibayama et al. | |
| 2004/0229051 A1 | 11/2004 | Schaepkens et al. | |
| 2010/0102242 A1* | 4/2010 | Burr et al. | 250/370.11 |
| 2010/0305427 A1* | 12/2010 | Huber et al. | 600/424 |
| 2011/0024711 A1 | 2/2011 | Li et al. | |
| 2012/0037809 A1 | 2/2012 | Levene et al. | |
| 2012/0193542 A1* | 8/2012 | Yamada | 250/366 |

FOREIGN PATENT DOCUMENTS

WO    2008148815 A1    12/2008

* cited by examiner

*Primary Examiner* — David Porta  
*Assistant Examiner* — Mindy Vu

(57) ABSTRACT

An x-ray detector assembly is disclosed that includes a mounting substrate having a plurality of electrical contacts, the mounting substrate comprising one of an integrated circuit and a circuit board. The x-ray detector assembly also includes a first electrode patterned on a first portion of a top surface of the mounting substrate, wherein the first electrode is electrically coupled to the plurality of electrical contacts. An organic photodiode layer is formed atop the first electrode and has a bottom surface electrically connected to the first electrode. A second electrode is coupled to a top surface of the organic photodiode layer and a scintillator is coupled to the second electrode.

19 Claims, 13 Drawing Sheets

ORGANIC X-RAY DETECTOR ASSEMBLY AND METHOD OF MANUFACTURING SAME

BACKGROUND OF THE INVENTION

Embodiments of the invention relate generally to diagnostic imaging and, more particularly, to an organic x-ray detector assembly and a method for manufacturing an organic x-ray detector assembly.

Typically, in computed tomography (CT) imaging systems, an x-ray source emits a fan-shaped beam toward a subject or object, such as a patient or a piece of luggage. Hereinafter, the terms "subject" and "object" shall include anything capable of being imaged. In particular, an x-ray tube included in the x-ray source emits the x-ray beam at a focal point. The beam, after being attenuated by the subject, impinges upon an array of radiation or x-ray detectors.

In known CT systems, the x-ray beam is projected from the x-ray source through a pre-patient collimator that defines the x-ray beam profile in the patient axis, or z-axis. The collimator typically includes an x-ray-absorbing material with an aperture therein for restricting the x-ray beam.

Generally, the x-ray source and the detector array are rotated about the gantry within an imaging plane and around the subject so that the angle at which the x-ray beam intersects the subject is constantly changing. A group of x-ray attenuation measurements, i.e., projection data, from the detector array at one gantry angle is referred to as a "view". A "scan" of the subject comprises a set of views made at different gantry angles or view angles, during one revolution of the x-ray source and detector.

X-ray detectors for such CT imaging systems typically are configured in a circular arc centered to the focal spot. Such detectors include an additional collimator for collimating x-ray beams received at the detector with focus to the focal spot.

Conventional CT detectors also include a scintillator component and photodiode component adjacent the collimator. The scintillator component illuminates upon reception of radiographic energy and the photodiode component detects illumination of the scintillator component and provides an electrical signal as a function of the intensity of illumination. Each scintillator element of the scintillator component converts x-rays to light energy and discharges the light energy to an adjacent photodiode element. The light emitted by each scintillator element is a function of the number of x-rays that impinge upon the scintillator element as well as the energy level of the x-rays.

The photodiode component of typical CT detectors is manufactured using a rigid semiconductor material such as silicon. Each photodiode element in the CT detector detects the light energy and generates a corresponding electrical signal as a function of the light emitted by a corresponding photodiode element. The electrical signal generated by the photodiode element is indicative of the attenuated beam received by each scintillator element. The outputs of the photodiode elements are then transmitted to the data processing system for image reconstruction.

Each pixel in a generated x-ray image is formed based on the output signal from an individual photodiode element, which is fed to the image processing unit by way of a dedicated electrical channel bonded to the photodiode element. As such, high resolution image detectors (i.e., detectors with well over 10,000 pixels) include a complex pattern of electrical channels that run across the surface of the photodiode array or through internal layers within the photodiode array to electrically couple the respective photodiode elements to the digital readout electronics and/or application specific integrated circuits (ASICs). The portion of the surface of the detector that includes the electrical channels and bonding pads forms a dead zone on the detector surface. Electrode layers are affixed to contact points on the top and/or bottom sides of the semiconductor material to create a pattern of electrical.

High-resolution CT image detectors with silicon photodiodes are complex and expensive to manufacture and pattern due in part to the large number of conductor channels and connections between the photodiode elements and digital readout electronics. Further, precise alignment between the large number of respective pairs of rigid photodiode elements and scintillator elements further adds to manufacturing cost and complexity.

Therefore, it would be desirable to design a detector for a CT imaging system that overcomes the aforementioned drawbacks of conventional CT image detectors. It would further be desirable to reduce costs associated with fabricating a CT image detector.

BRIEF DESCRIPTION OF THE INVENTION

In accordance with one aspect of the invention, an x-ray detector assembly includes a mounting substrate having a plurality of electrical contacts, the mounting substrate comprising one of an integrated circuit and a circuit board. The x-ray detector assembly also includes a first electrode patterned on a first portion of a top surface of the mounting substrate, wherein the first electrode is electrically coupled to the plurality of electrical contacts. An organic photodiode layer is formed atop the first electrode and has a bottom surface electrically connected to the first electrode. A second electrode is coupled to a top surface of the organic photodiode layer and a scintillator is coupled to the second electrode.

In accordance with another aspect of the invention, a method of manufacturing an x-ray detector assembly for a computed tomography (CT) system includes providing a mounting substrate, the mounting substrate including one of an application-specific integrated circuit (ASIC) and a circuit board. The method also includes patterning a bottom electrode on a first portion of a top surface of the mounting substrate such that the bottom electrode is electrically coupled to electrical connections of the mounting substrate. Further, the method includes coating the bottom electrode with an organic photodiode solution, disposing a top electrode on the organic photodiode solution, and optically coupling a scintillator array to the top electrode.

In accordance with another aspect of the invention, a computed tomography (CT) detector assembly includes a first detector sub-assembly having a rigid semiconductor photodiode substrate and a second detector sub-assembly coupled to the first detector sub-assembly. The second detector sub-assembly includes a flexible substrate layer having a plurality of electrically conductive vias formed through a thickness thereof, a first electrode having a bottom surface coupled to the plurality of conductive vias, and an organic photodiode layer having a bottom surface coupled to a top surface of the first electrode. The second detector sub-assembly also includes a second electrode having a bottom surface coupled to a top surface of the organic photodiode layer and a scintillator array coupled to a top surface of the second electrode.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

The operating environment of the invention is described with respect to a sixty-four-slice computed tomography (CT) system. However, it will be appreciated by those skilled in the art that the invention is equally applicable for use with other multi-slice configurations. In addition, while embodiments of the invention are described with respect to image reconstruction techniques for use with CT systems, one skilled in the art will recognize that the concepts set forth herein are not limited to CT and can be applied to reconstruction techniques used with other imaging modalities in both the medical field and non-medical field, such as, for example, an x-ray system, a PET system, a SPECT system, an MR system, or any combination thereof. Moreover, the invention will be described with respect to the detection and conversion of x-rays. However, one skilled in the art will further appreciate that the invention is equally applicable for the detection and conversion of other high frequency electromagnetic energy. The invention will be described with respect to a "third generation" CT scanner, but is equally applicable with other CT systems.

Figure 1:
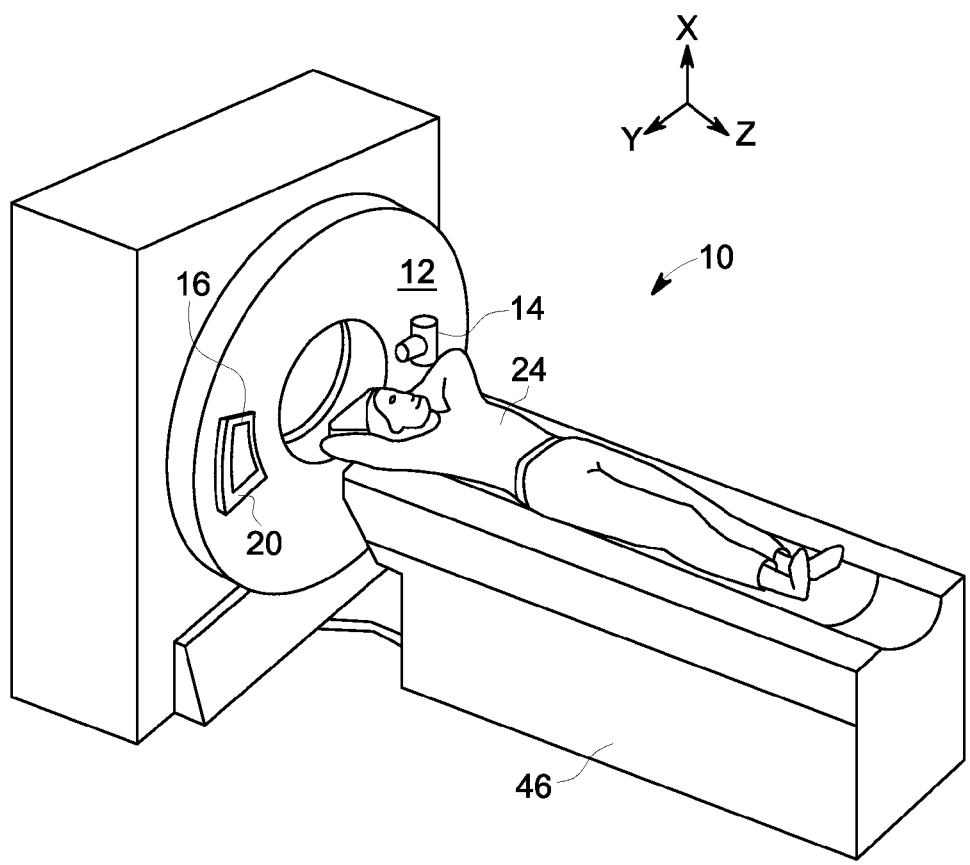
FIG. 1 is a pictorial view of a CT imaging system.
Figure 2:
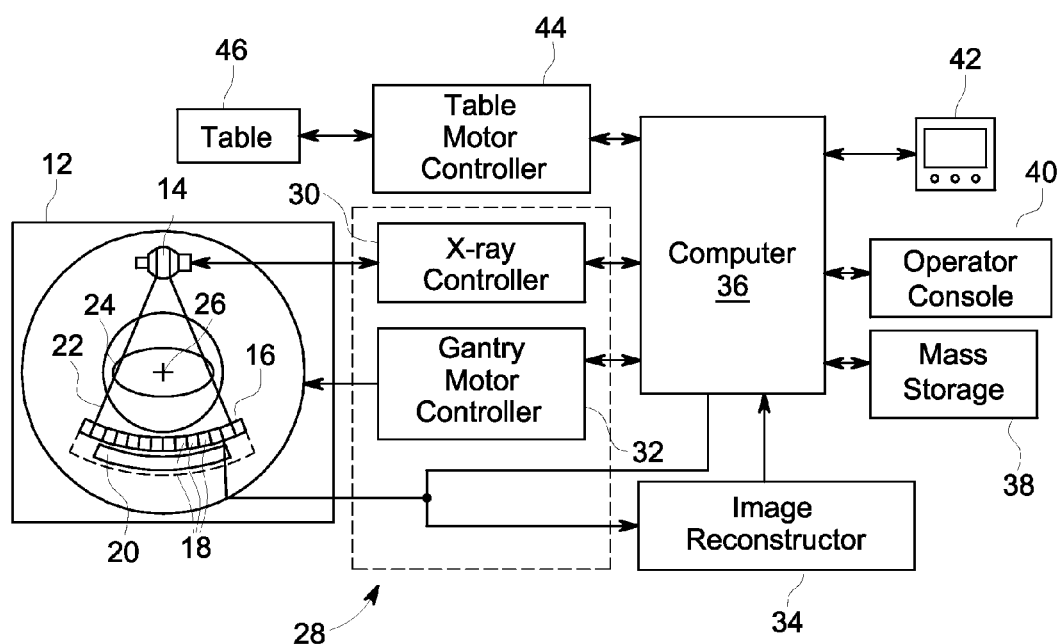
FIG. 2 is a block schematic diagram of the system illustrated in FIG. 1.

Referring to FIG. 1, a computed tomography (CT) imaging system 10 is shown as including a gantry 12 representative of a "third generation" CT scanner. Gantry 12 has an x-ray source 14 that projects a beam of x-rays toward a detector assembly or collimator 16 on the opposite side of the gantry 12. Referring now to FIG. 2, detector assembly 16 is formed by a plurality of detectors or detector modules 18 and data acquisition systems (DAS) 20. The plurality of detectors 18 sense the projected x-rays 22 that pass through a medical patient 24, and DAS 20 converts the data to digital signals for subsequent processing. Each detector 18 produces an analog electrical signal that represents the intensity of an impinging x-ray beam and hence the attenuated beam as it passes through the patient 24. During a scan to acquire x-ray projection data, gantry 12 and the components mounted thereon rotate about a center of rotation 26.

Rotation of gantry 12 and the operation of x-ray source 14 are governed by a control mechanism 28 of CT system 10. Control mechanism 28 includes an x-ray controller 30 that provides power and timing signals to an x-ray source 14 and a gantry motor controller 32 that controls the rotational speed and position of gantry 12. An image reconstructor or computer processor 34 receives sampled and digitized x-ray data from DAS 20 and performs high speed reconstruction. The reconstructed image is applied as an input to a computer 36 which stores the image in a mass storage device 38.

Computer 36 also receives commands and scanning parameters from an operator via console 40 that has some form of operator interface, such as a keyboard, mouse, voice activated controller, or any other suitable input apparatus. An associated display 42 allows the operator to observe the reconstructed image and other data from computer 36. The operator supplied commands and parameters are used by computer 36 to provide control signals and information to DAS 20, x-ray controller 30 and gantry motor controller 32. In addition, computer 36 operates a table motor controller 44 which controls a motorized table 46 to position patient 24 and gantry 12.

Figure 3:
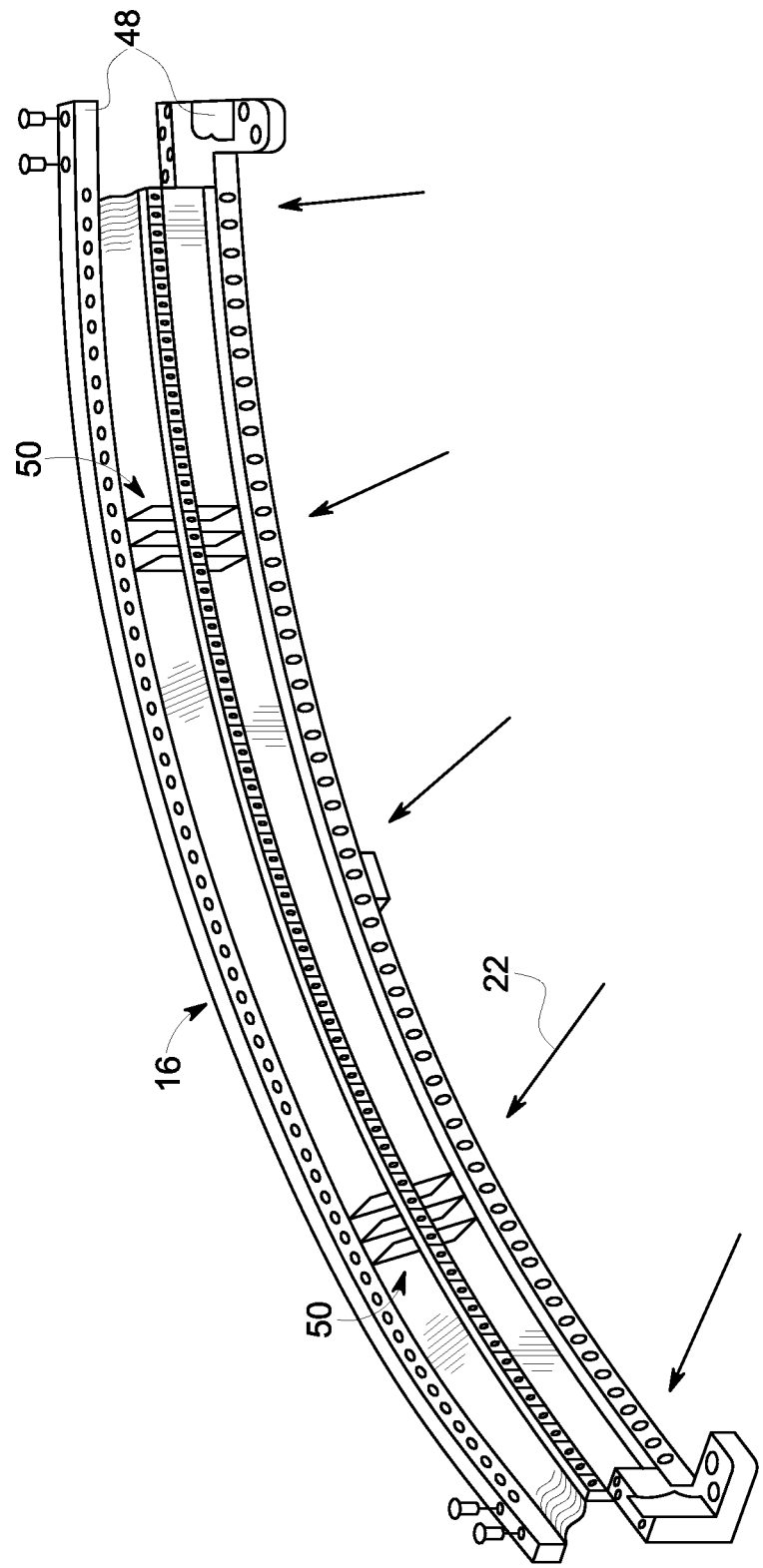
FIG. 3 is a perspective view of one embodiment of a CT system detector assembly.

As shown in FIG. 3, detector assembly 16 includes rails 48 having collimating blades or plates 50 placed therebetween. Plates 50 are positioned to collimate x-rays 22 before such beams impinge upon, for instance, scintillator array 54 of FIG. 4 positioned on detector assembly 16.

Figure 4:
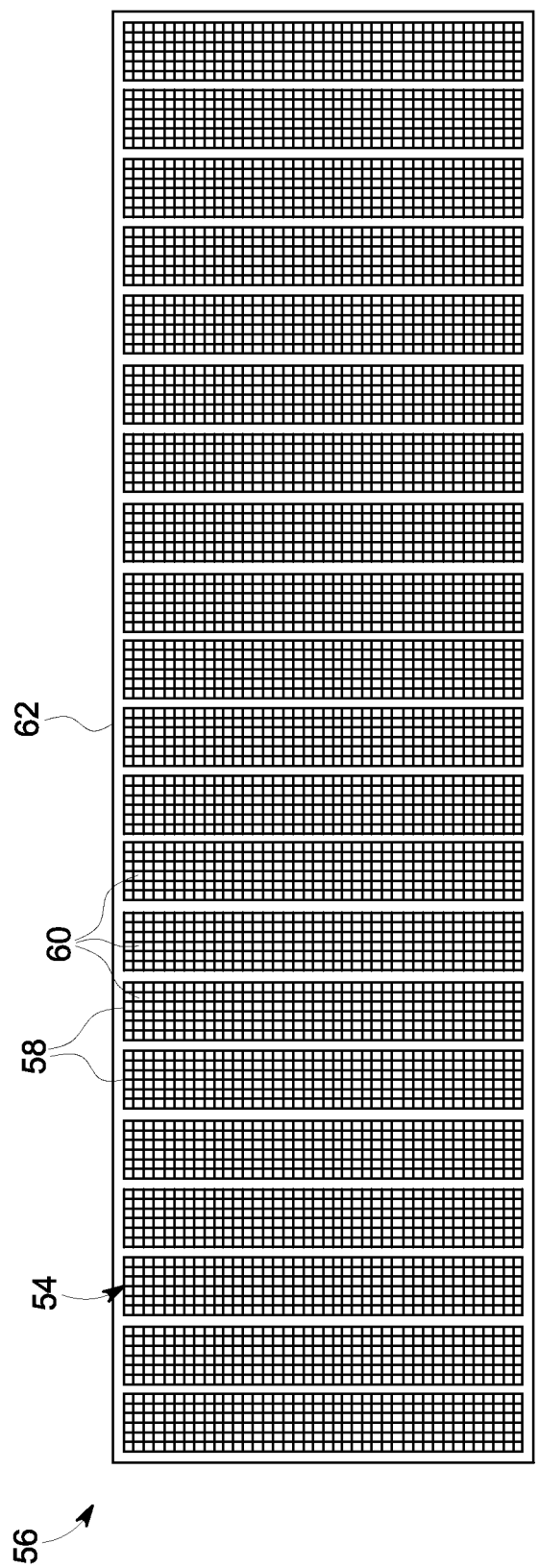
FIG. 4 is a top view a detector assembly in accordance with an embodiment of the invention.
Figure 6:
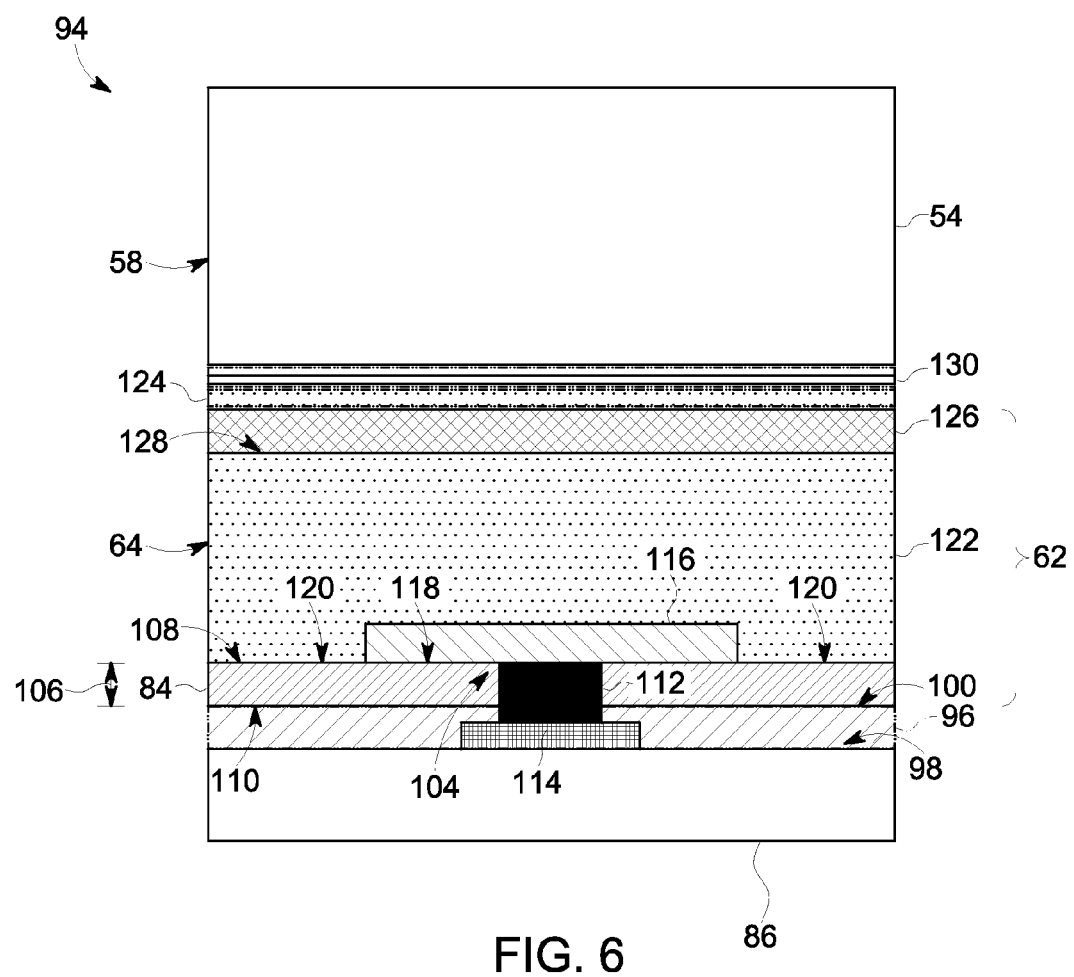
FIG. 6 is a cross-sectional view of a portion of the detector assembly of FIG. 4, in accordance with an embodiment of the invention.

Referring now to FIG. 4, a schematic top view of an exemplary detector assembly 56, such as detector assembly 16 of FIG. 1, is shown according to one embodiment of the invention. Detector assembly 56 includes a scintillator array 54 composed of a phosphor material that is capable of converting x-rays to visible light. The wavelength region of light emitted by scintillator array 54 ranges from about 360 nm to about 830 nm, in one embodiment. According to one embodiment, scintillator array 54 includes 57 scintillator packs 58, each scintillator pack 58 having an array size of 60×16 of pixel elements 60 approximately 1 mm in size. As a result, detector assembly 56 has 64 rows and 912 columns (16×57 detectors) which allows 64 simultaneous slices of data to be collected with each rotation of gantry 12. Scintillator packs 58 are positioned on an organic photodiode array 62 having a plurality of photodiode elements 64 (FIG. 6).

Figure 5:
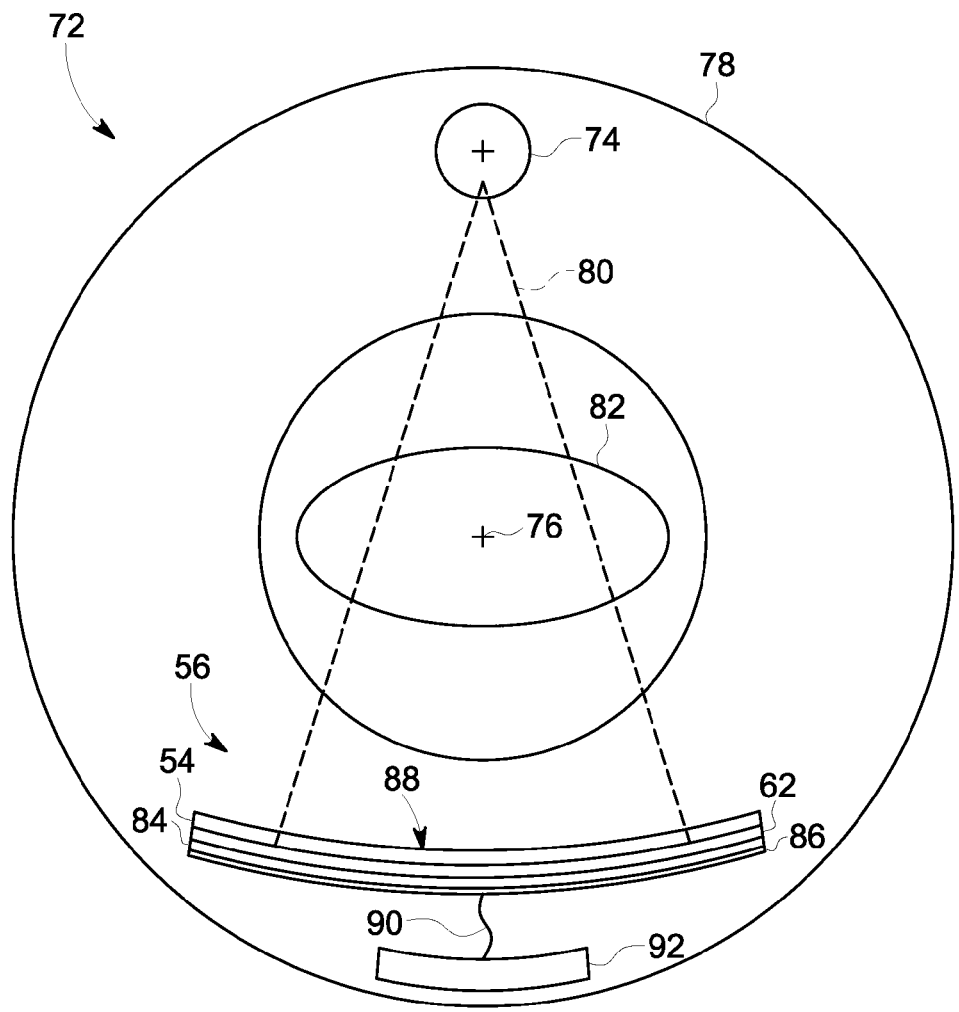
FIG. 5 is a side view of a portion of an imaging system incorporating the detector assembly of FIG. 4, in accordance with an embodiment of the invention.

FIG. 5 illustrates a side view diagram of a portion of an imaging system 72, such as, for example, CT imaging system 10 of FIG. 1, including detector assembly 56. Imaging system 72 includes an x-ray source 74 that is configured to rotate about a center of rotation 76 of a rotatable gantry 78. A beam of x-rays 80 is produced when high-speed electrons emitted from x-ray source 74 impact the surface of a target portion (not shown) of x-ray source 74. Beam of x-rays 80 passes through a patient 82 and impinges upon detector assembly 56. As shown in FIG. 5, detector assembly 56 had a convex curvature in the y-direction of the imaging system 72. In one embodiment, detector assembly 56 may also be constructed to have a convex curvature in the in-plane or z-direction of the imaging system 72.

Referring now to FIGS. 4 and 5 together, detector assembly 56 includes a scintillator array 54, a photodiode array 62 formed on a flexible substrate 84, and an ASIC layer 86 that includes a number of individual semiconductor chips bonded to flexible substrate 84. As shown, detector assembly 56 is aligned with x-ray source 74 such that beam of x-rays 80 passes through medical patient 82 and impinges upon a top surface 88 of scintillator array 54. Scintillator array 54 includes a plurality of individual scintillator elements pixel elements 60 arranged in a pattern of rows and channels along the surface of scintillator array 54. Organic photodiode array 62 includes a plurality of individual photodiode elements 64 (FIG. 6) corresponding to each respective scintillator element of scintillator array 54.

During operation of imaging system 72, x-rays impinging within pixel elements 60 of scintillator array 54 generate photons which traverse scintillator pack 58, thereby generating an analog signal which is detected on a photodiode element 64 (FIG. 6) within photodiode array 62. One or more electrical readouts 90 electrically coupled to photodiode array 62 transmits electrical signals received by ASIC 86 to a data acquisition system 92, such as DAS 20 of FIG. 2. Data acquisition system 92 converts the data to digital signals, which are transmitted to an image reconstructor, such as image reconstructor 34 (FIG. 2) for reconstruction.

FIG. 6 is a magnified cross-sectional view of a portion of a detector assembly 94 illustrating the layered structure of detector assembly 56, according to one embodiment of the invention. The build-up process begins by providing an ASIC 86 having an optional solder mask layer 96 (shown in phantom) formed on a top surface 98 of ASIC 86. A flexible substrate 84 is then formed on a top surface 100 of optional solder mask layer 96 if used, or on top surface 98 of ASIC 86 in embodiments where optional solder mask layer 96 is omitted. According to various embodiments, flexible substrate 84 is a thin, flexible material such as a glass or plastic substrate. Flexible substrate 84 may be, for example, polyethylene terephthalate, polybutylene phthalate, polyethylene naphthalate, polystyrene, polycarbonate, polyether sulfone, polyallylate, polyimide, polycycloolefin, norbornene resins, and fluoropolymers, metals such as stainless steel, aluminum, silver and gold, metal oxides, such as titanium oxide and zinc oxide, and semiconductors such as silicon. According to one embodiment, flexible substrate 84 has a thickness in a range of approximately 50 microns to several hundred microns.

A pattern of thru-holes 104 is formed through the thickness of flexible substrate 84. In one embodiment, thru-holes 104 are formed by laser drilling. As shown, thru-holes 104 extend through a thickness 106 of flexible substrate 84 defined between the top surface 108 and bottom surface 110 of the substrate 84. The thru-holes 104 are then filled with a conductive material to form conductive vias 112 that are electrically coupled to electrical contacts 114 of ASIC 86. An anode layer or bottom electrode 116 is disposed on a first portion 118 of a top surface 108 of flexible substrate 84. According to one embodiment, bottom electrode is patterned on flexible substrate 84 using, for example, a thin film deposition or electroplating technique. Bottom electrode 116 is formed of a conductive and transparent material, such as, for example, metals such as aluminum, copper, silver, gold, and transparent conductive oxides, such as indium tin oxide (ITO).

Bottom electrode 116 and the exposed, second portion 120 of top surface 108 of flexible substrate 84 are coated with an organic photodiode material 122. Organic photodiode material 122 forms a continuous, unpatterned bulk hetero junction organic photodiode layer that absorbs light, separates charge, and transports holes and electrons to the bottom electrode 116. According to various embodiments, organic photodiode material 122 may be formed as a single or multi-layer stack.

In a multi-layer stack embodiment, organic photodiode material 122 may include an electron blocking layer that is formed on a top or bottom surface of the multi-layer stack. According to various embodiments, electron blocking layer may include aromatic tertiary amines and polymeric aromatic tertiary amines. Examples of suitable materials for electron blocking layer include poly-TPD (poly(4-butylphenyl-diphenylamine), poly(N,N'-bis(4-butylphenyl)-N,N'-bis(phenyl) benzidine, 4,4',N,N'-diphenylcarbazole, 1,3,5-tris(3-methyl-diphenyl-amino)benzene, N,N'-bis(1-naphtalenyl)-N—N'-bis(phenylbenzidine), N,N'-Bis-(3-methylphenyl)-N,N'-bis (phenyl) benzidine, N,N'-bis(2-naphtalenyl)-N—N'-bis-(phenylbenzidine), 4,4',4"-tris(N,N-phenyl-3-methylphenylamino)triphenylamine, poly[9,9-dioctylfluorenyl-2,7-dyil)-co-(N,N'bis-(4-butylphenyl-1,1'-biphenylene-4,4-diamine)], poly(N,N'-bis(4-butylphenyl)-N,N'-bis(phenyl)benzidine, poly[(9,9-dihexylfluorenyl-2,7-diyl)-co-(N,N'bis{p-butylphenyl}-1,4-diamino-phenylene)], NiO, MoO3, tri-p-tolylamine, 4,4',4"-tris[phenyl(m-tolyl) amino]triphenylamine, 4,4',4"-tris[2-naphthyl(phenyl) amino] diphenylamine, 1,3,5-tris[(3-methylphenyl)phenylamino] benzene, 1,3,5-tris(2-(9-ethylcabazyl-3)ethylene) benzene, 1,3,5-tris(diphenylamino) benzene, tris[4-(diethylamino)phenyl]amine, tris(4-carbazoyl-9-ylphenyl) amine, titanyl phthalocyanine, tin(IV) 2,3-naphthalocyanine dichloride, N,N,N',N'-tetraphenyl-naphthalene-2,6-diamine, tetra-N-phenylbenzidine, N,N,N',N'-tetrakis(2-naphthyl) benzidine, N,N,N',N'-tetrakis(3-methylphenyl)-3,3'-dimethylbenzidine, N,N,N',N'-tetrakis(4-methoxyphenyl)benzidine, poly(2-vinylnaphthalene), poly(2-vinylcarbazole), poly (N-ethyl-2-vinylcarbazole), poly(copper phthalocyanine), poly[bis(4-phenyl)(2,4,6-trimethylphenyl)amine], dipyrazino[2,3-f:2',3'-h]quinoxaline-2,3,6,7,10,11-hexacarbonitrile 99%, N,N'-diphenyl-N,N'-di-p-tolylbenzene-1,4-diamine, 4-(diphenylamino)benzaldehyde diphenylhydrazone, N,N'-di(2-naphthyl-N,N'-diphenyl)-1,1'-biphenyl-4,4'-diamine, 9,9-dimethyl-N,N'-di(1-naphthyl)-N,N'-diphenyl-9H-fluorene-2,7-diamine, 2,2'-dimethyl-N,N'-di-[(1-naphthyl)-N,N'-diphenyl]-1,1'-biphenyl-4,4'-diamine, 4-(dibenzylamino)benzaldehyde-N,N-diphenyl-hydrazone, 4,4'-Cyclohexylidenebis[N,N-bis(4-methylphenyl)benzenamine], N,N'-Bis(phenanthren-9-yl)-N,N'-bis(phenyl)-benzidine, N,N'-Bis(3-methylphenyl)-N,N'-diphenylbenzidine, 4,4'-Bis(3-ethyl-N-carbazolyl)-1,1'-biphenyl, 1,4-Bis(diphenylamino)benzene, 4,4'-Bis(N-carbazolyl)-1,1'-biphenyl, 4,4'-Bis(N-carbazolyl)-1,1'-biphenyl, and 1,3-Bis(N-carbazolyl)benzene. In some embodiments, a donor material may function as the electron blocking layer material, and a charge blocking layer may be absent.

Similarly, an optional hole blocking layer may be formed on the opposing surface of the multi-layer stack. An optional hole blocking layer (not shown) may be disposed on organic photodiode material 122. Suitable materials for the hole blocking layer include phenanthroline compounds, such as, for example, 2,9-dimethyl-4,7-diphenyl-1,10-phenanthroline (BCP).

According to one embodiment, organic photodiode material 122 includes a mixture of a donor material containing a low bandgap polymer, an acceptor material containing a fullerene material, and a solvent. The highest occupied molecular orbital (HOMO) and lowest unoccupied molecular orbital (LUMO) levels of the donor and acceptor materials are compatible with an optional electron blocking layer, optional hole blocking layer, and a transparent top electrode 126 formed on organic photodiode material 122 in order to allow efficient extraction without creating an energetic barrier. The absorber contains a fullerene material, a low bandgap polymer, and a solvent. The solvent solubilizes both donor and acceptor materials over a range of concentrations, and yields desired film microstructures and thicknesses. Non-limiting examples of the solvent material include 1,2-dichlorobenzene, chlorobenzene, xylenes, methyl-naphthalene, and combinations thereof.

Suitable donor materials, may be, for example, low bandgap polymers having LUMO ranging from about 3.1 eV to about 3.5 eV, and HOMO ranging from about 4.9 eV to about 5.5 eV. Low bandgap polymers include conjugated polymers and copolymers composed of units derived from monoheterocyclic and polyheterocyclic monomers such as, for example, thiophene, fluorene, phenylenvinylene, carbazole, pyrrolopyrrole, and fused heteropolycyclic monomers containing the thiophene ring, including, but not limited to, thienothiophene, benzodithiophene, benzothiadiazole, pyrrolothiophene monomers, and substituted analogs thereof. Examples of suitable materials for use as low bandgap polymers in the organic x-ray detectors according to the present invention include, for example, copolymers derived from thieno-thiophene and benzodithiophene monomers, such as poly[[4,8-bis[(2-ethyl hexyl)oxy]benzo[1,2-b:4,5-b'] dithiophene-2,6-diyl][3-fluoro-2-[(2-ethylhexyl)carbonyl] thieno[3,4-b] (PTB7), and copolymers derived from carbazole, thiophene, and benzothiadiazole monomers, such as, for example, 2,1,3-benzothiadiazole-4,7-diyl[4,4-bis(2-ethylhexyl)-4H-cyclopenta[2,1-b:3,4-b']dithiophene-2,6-diyl (PCPDTBT), and poly[[9-(1-octylnonyl)-9H-carbazole-2,7-diyl]-2,5-thiophenediyl-2,1,3-benzothiadiazole-4,7-diyl-2,5-thiophenediyl] (PCDTBT).

According to various embodiments, the acceptor material of organic photodiode material 122 may include, for example, fullerene derivatives such as [6,6]-phenyl-$C_{61}$-butyric acid methyl ester (PCBM), PCBM analogs such as $PC_{71}BM$ and bis-$PC_{71}BM$, and indene-$C_{60}$ bisadduct (ICBA). Fluorene copolymers such as poly[(9,9-dioctylfluorenyl-2,7-diyl)-alt-(4,7-bis(3-hexylthiophen-5-yl)-2,1,3-benzothiadiazole)-2', 2"-diyl] (F8TBT) may also be used, alone or with a fullerene material.

As shown, scintillator array 54 is disposed on transparent top electrode 126. According to various embodiments, transparent top electrode 126 may be a thin, evaporated metal layer, a sputtered transparent conducting oxide (TCO) material, or a solution-coated conductor. In a preferred embodiment, top electrode 126 is formed as a continuous, unpatterned layer on a top surface 128 of organic photodiode material 122. Alternatively, transparent top electrode 126 may be divided in a pattern atop organic photodiode material 122. Top electrode 126 is a conductive material with compatible energy levels to allow extraction of electrons without a barrier to extraction, transparent at the wavelength of emissions from scintillator array 54, preferably high in the transmission to visible light, and low in resistance value. Suitable materials for transparent top electrode 126 include, as examples, transparent conductive oxides (TCO) and thin films of metals such as gold and silver. Examples of suitable TCO include ITO, which has a low resistance and transparency, IZO, AZO, FTO, $SnO_2$, $TiO_2$, and ZnO.

Together, flexible substrate layer 84, conductive vias 112, bottom electrode 116, organic photodiode material layer 122, and transparent top electrode 126 form organic photodiode array 62.

An optional protection or barrier layer 124 (shown in phantom) may be positioned between scintillator array 54 and transparent top electrode 126, as shown in FIG. 6. According to one embodiment, barrier layer 124 may comprise at least one of silicon, a metal oxide, a metal nitride, and combinations thereof, wherein the metal is one of indium, tin, zinc, titanium, and aluminum. Non-limiting examples of metal nitrides and metal oxides include indium zinc oxide (IZO), indium tin oxide (ITO), silicon oxide, silicon nitride, silicon oxynitride, aluminum oxide, aluminum oxynitride, zinc oxide, indium oxide, tin oxide, cadmium tin oxide, cadmium oxide, and magnesium oxide.

In addition, an optional adhesive layer 130 (shown in phantom) may be provided to couple scintillator array 54 to transparent top electrode 126. Optional adhesive layer 130 may be, for example, a clear epoxy or pressure sensitive adhesive.

Figure 7:
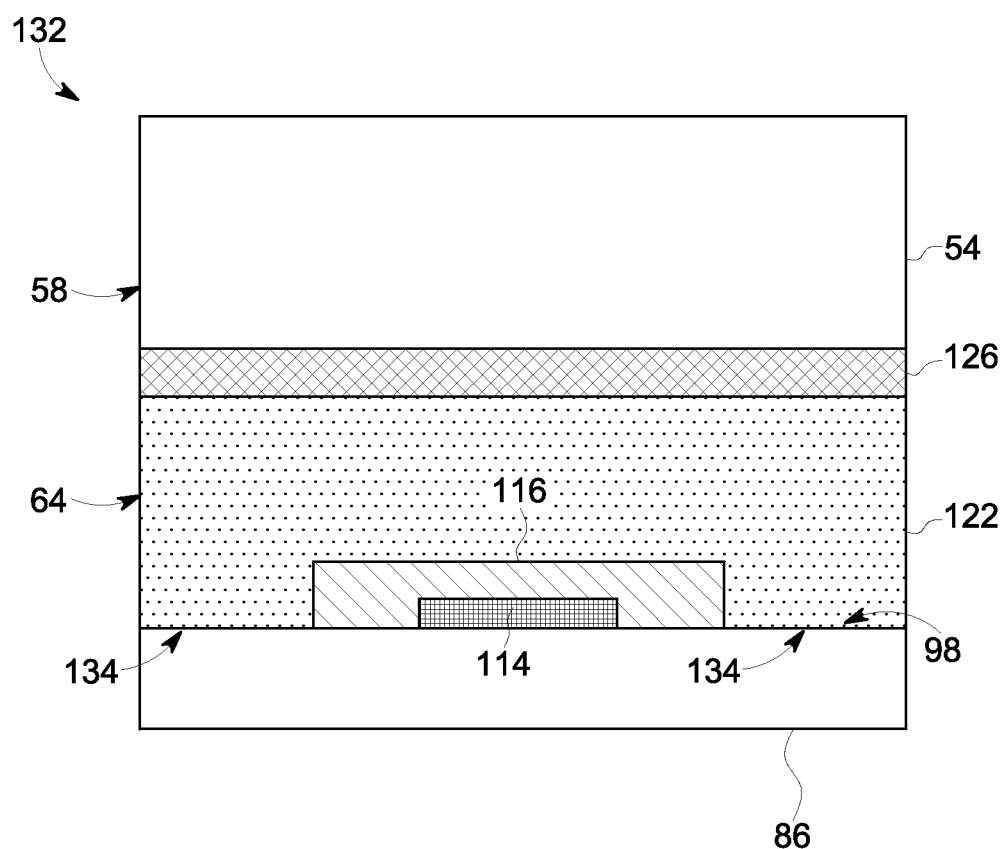
FIG. 7 is a cross-sectional view of a portion of the detector assembly of FIG. 4, in accordance with another embodiment of the invention.

FIG. 7 illustrates a portion of a detector assembly 132 according to an alternative embodiment of the invention. Elements and components common to detector assembly 94 described with respect to FIG. 6 will be discussed relative to the same reference numbers as appropriate. In the embodiment illustrated in FIG. 7, bottom electrode 116 is patterned directly on top surface 98 of ASIC 86 in a region of the top surface 98 corresponding to electrical contacts 114. As shown, bottom electrode 116 wraps around and encapsulates electrical contacts 114. Organic photodiode material 122 is then deposited atop bottom electrode 116 and ASIC 86 to encapsulate bottom electrode 116 and coat the non-contact portion 134 of the top surface 98 of ASIC 86 adjacent electrical contacts 114 and bottom electrode 116.

Figure 8:
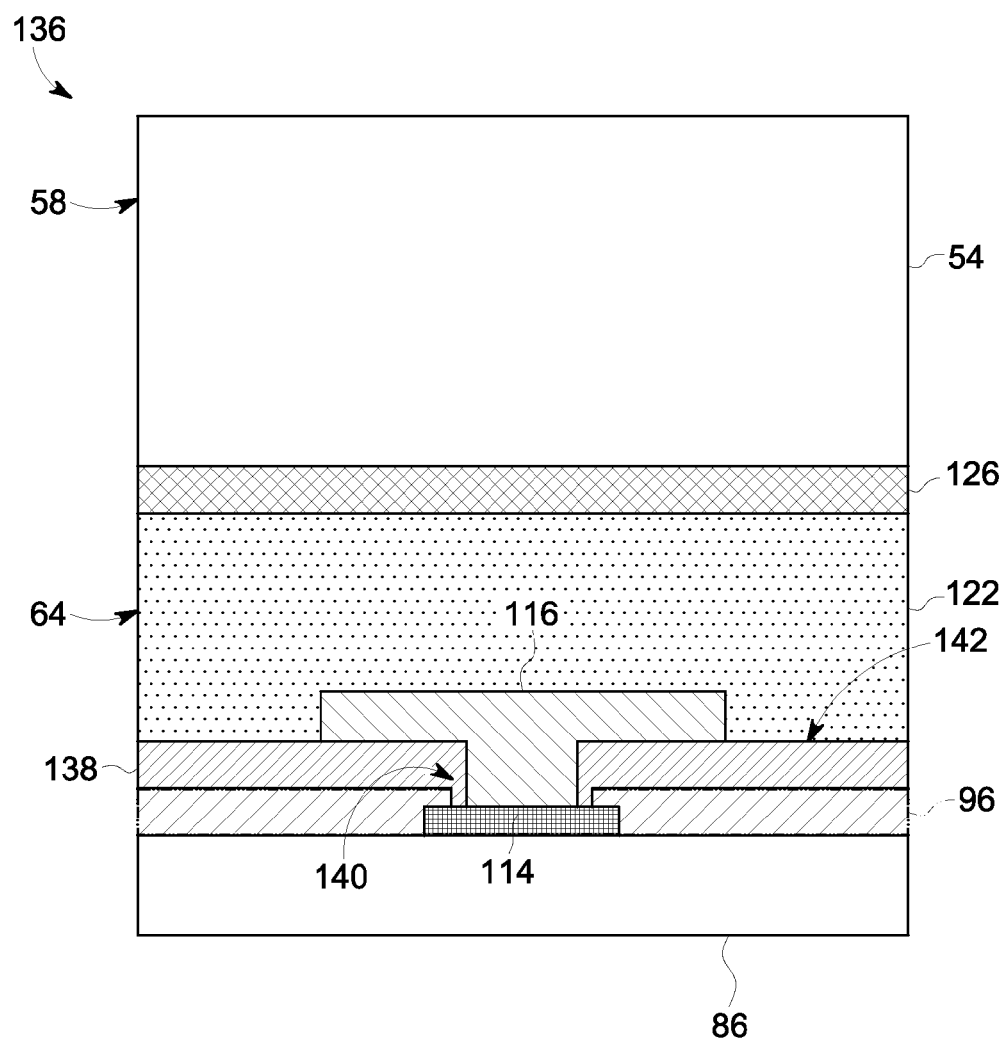
FIG. 8 is a cross-sectional view of a portion of the detector assembly of FIG. 4, in accordance with yet another embodiment of the invention.

Referring now to FIG. 8, a portion of a detector assembly 136 is illustrated in accordance with yet another embodiment of the invention. Again, elements and components common to detector assembly 94 described with respect to FIG. 6 will be discussed relative to the same reference numbers as appropriate. In addition to the components common with detector assembly 94, detector assembly 136 includes a smoothing layer or planarization layer 138 formed using a polyimide, acrylate, or low solvent content silicon, as non-limiting examples. According to various embodiments, planarization layer 138 may be deposited directly onto top surface 98 of ASIC 86 or may be formed atop optional solder mask layer 96 (shown in phatom). Planarization layer 138 smooths the surface of ASIC 86 prior to deposition of the organic photodiode material 122. A via 140 is etched into planarization layer 138 at the location of electrical contacts 114. Bottom electrode 116 is then formed on the top surface 142 of planarization layer 138 and extends through via 140 to create an electrical connection with electrical contacts 114.

Figure 9:
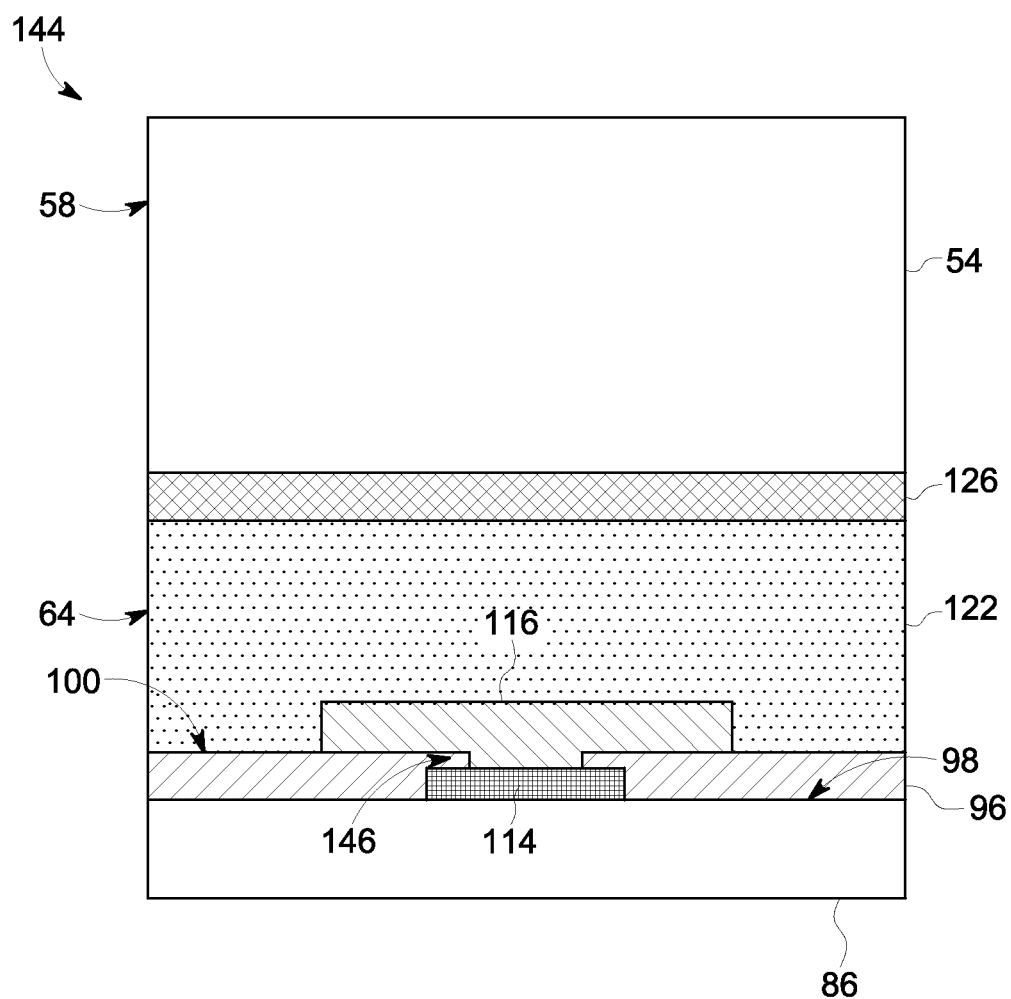
FIG. 9 is a cross-sectional view of a portion of the detector assembly of FIG. 4, in accordance with yet another embodiment of the invention.

FIG. 9 illustrates a portion of a detector assembly 144 according to an alternative embodiment. Again, elements and components common to detector assembly 94 described with respect to FIG. 6 will be discussed relative to the same reference numbers as used in FIG. 6 where appropriate. As shown, detector assembly 144 includes a solder mask layer 96 provided on top surface 98 of ASIC 86. Bottom electrode 116 is then formed on top surface 100 of solder mask layer 96 and extends through an opening 146 in solder mask layer 96 to couple with electrical contacts 114.

Figure 10:
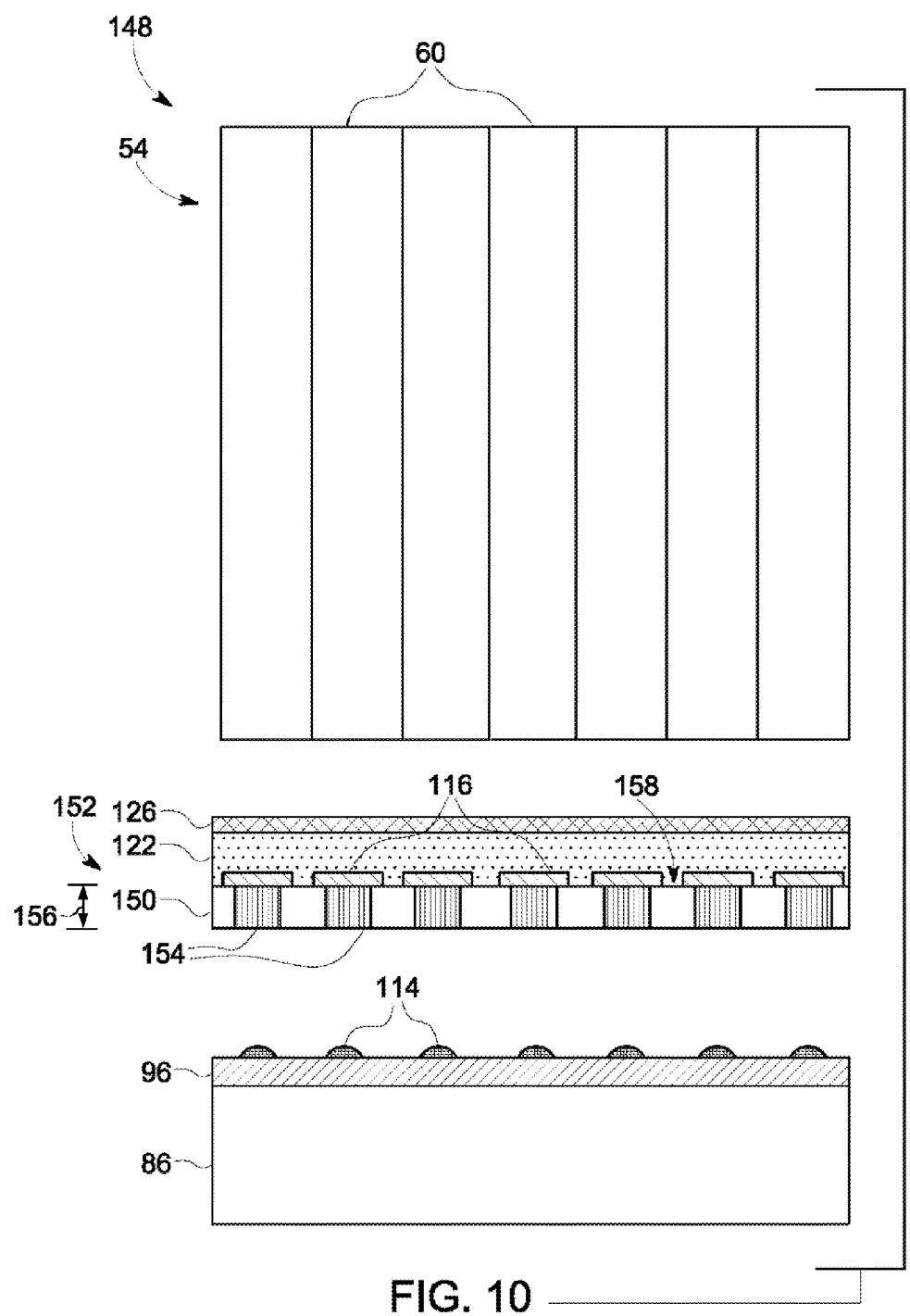
FIG. 10 is a cross-sectional view of a portion of the detector assembly of FIG. 4, in accordance with yet another embodiment of the invention.

Referring now to FIG. 10, a portion of a detector assembly 148 is shown according to an alternative embodiment that includes a circuit board 150. Detector assembly 148 is illustrated in a partially exploded cross-sectional view in FIG. 10 for clarity of the separate electrical contacts of the components thereof. Further, those elements and components common to portion 94 of detector assembly 56 (FIG. 6) are discussed relative to the same reference numbers as appropriate.

Detector assembly 148 includes three sub-assemblies: scintillator array 54, organic photodiode assembly 152, and ASIC 86. Referring first to organic photodiode array 152, circuit board 150 includes a number of conductive vias 154 formed through a thickness 156 of circuit board 150. In one embodiment, circuit board 150 includes a fiber reinforced plastic substrate or FR-4 substrate, with copper thru vias and solder contacts. Bottom electrode layer 116 is patterned on a top surface 158 of circuit board 150 at locations corresponding to conductive vias 154. Organic photodiode material 122 is then deposited over bottom electrode 116 and the exposed portions of top surface 158 of circuit board 150. Transparent top electrode 126 coats the top surface 128 of organic photodiode material 122. According to alternative embodiments, an optional solder mask layer, such as solder mask layer 96 of FIG. 9, may be positioned between circuit board 150 and organic photodiode material 122. Following deposition of the organic photodiode material 122 and formation of transparent top electrode 126, the ASIC 86 may be joined to the organic photodiode array 152 using solder reflow or conductive adhesive and the scintillator array 54 may be attached to organic photodiode array 152 using a clear epoxy or pressure sensitive adhesive.

As one skilled in the art will recognzie, the embodiments illustrated in FIGS. 7-10 may include either or both of the optional barrier layer 124 and optional adhesive layer 130.

Figure 11:
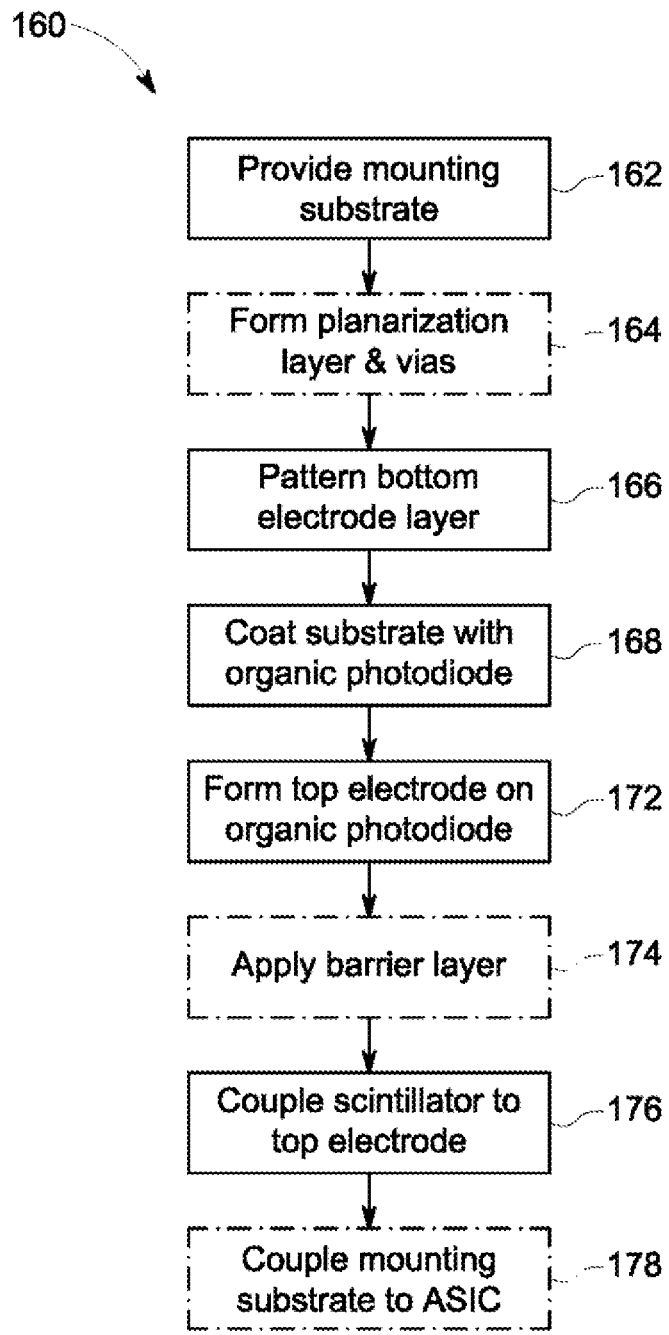
FIG. 11 illustrates a technique for manufacturing a detector assembly for a CT imaging system, in accordance with an embodiment of the invention.

FIG. 11 illustrates a technique 160 for fabricating a detector assembly, such as detector assembly 56, according to an embodiment of the invention. Technique 160 begins at block 162 by providing a base substrate or mounting substrate. According to various embodiments, the mounting substrate may be a flexible substrate such as flexible substrate 84 of FIG. 6, an ASIC, such as ASIC 86 illustrated in FIG. 7, an ASIC having a solder mask layer formed thereon, such as ASIC 86/solder mask layer 96 of FIG. 9, or a circuit board, similar to a circuit board 150 of FIG. 10. In embodiments where the mounting substrate is a flexible substrate, block 162 further includes a step of forming through-holes 104 in flexible substrate 84 using, for example, a laser ablation process. At optional block 164 (shown in phantom) a smoothing layer or planarization layer (e.g., planarization layer 138 of FIG. 8) is formed on a top surface of the mounting substrate and thru vias are formed through a thickness of the planarization layer. At block 166 bottom electrode 116 is metalized and patterned on a top surface of the mounting substrate, a top surface of the planarization layer, or a top surface of a solder mask layer depending on the embodiment. More specifically, in the embodiments that do not include a planarization layer, such as those described with respect to FIGS. 6 and 7, bottom electrode 116 is patterned directly onto the mounting substrate. In embodiments that include a solder mask layer but do not include a planarization layer, such as the embodiment illustrated in FIG. 9, bottom electrode 116 is patterned directly onto a top surface of the solder mask. Further, in embodiments that include a planarization layer, such as that illustrated in FIG. 8, bottom electrode 116 is patterned directly onto a top surface of the planarization layer. Bottom electrode 116 represents the single layer of patterning used during fabrication of organic photodiode array 62 to form the detector pixels, thereby reducing manufacturing cost and complexity.

At block 168 organic photodiode material 122 is applied to bottom electrode 116 and the exposed portions of the top surface of either the mounting substrate (in embodiments without a solder mask or planarization layer), the solder layer (in embodiments without a planarization layer), or the planarization layer. In some embodiments, an optional electron blocking layer is disposed on the bottom electrode 116 prior to the step of disposing the organic photodiode material 122. In order to prevent wash-out, the electron blocking layer may be cross-linked thermally or by radiation before the organic photodiode material 122 is coated thereon. The crosslinking process may be designed to prevent substrate deformation or device damage when a polymer material is used as flexible substrate 84. Alternatively, the optional electron blocking layer may be coated from an orthogonal solvent, that is, one that does not dissolve the material of photodiode material 122.

Organic photodiode material 122 may be coated onto flexible substrate 84 (or electron blocking layer when used) using a solution coating or thin film evaporation process, according to various embodiments. Following solution coating of the photodiode material 122, transparent top electrode 126 is sputter deposited onto the surface of organic photodiode material 122 at block 172. In one embodiment, transparent top electrode 126 is formed as an unpatterned, continuous layer that coats the top surface 128 of organic photodiode material 122.

At optional block 174 (shown in phantom), barrier layer 124 is formed on organic photodiode material 122. In embodiments where barrier layer 124 is disposed on the photodiode material 122 prior to the step of disposing the transparent top electrode 126, the cathode 126 is disposed directly on the barrier layer 124, by sputtering or any other suitable method.

The scintillator array 54 is then optically coupled to the transparent top electrode 126 at block 176. According to various embodiments, the scintillator array 54 may be present in the form of a screen or thin film deposited on transparent top electrode 126. Where the scintillator material is dispersed in a polymer film, scintillator array 54 may be attached to the transparent top electrode 126 via a pressure sensitive adhesive. Product electronics may then be bonded to the detector assembly 56 using a bump or TAB bonding technique, and assembled into a product enclosure.

In embodiments where the mounting substrate is a circuit board or flexible substrate, the mounting substrate may be mounted to an ASIC at optional block 178 (shown in phantom) such that electrical connections of the mounting substrate are electrically coupled to electrical connections of the ASIC.

In certain applications, the performance characteristics of organic photodiode material may be undesirable. For example, the organic photodiode material may not exhibit the desired temporal, spectral, or linearity characteristics desired for the CT system. Accordingly, in some embodiments of the invention, the continuous photodiode flexible substrate that spans the entire width of detector assembly 56 of FIG. 5 may be replaced with a detector assembly 180, such as that as illustrated in FIG. 12, which includes a combination of organic photodiode detector modules and conventional, rigid silicon detector modules, as described below.

Figure 12:
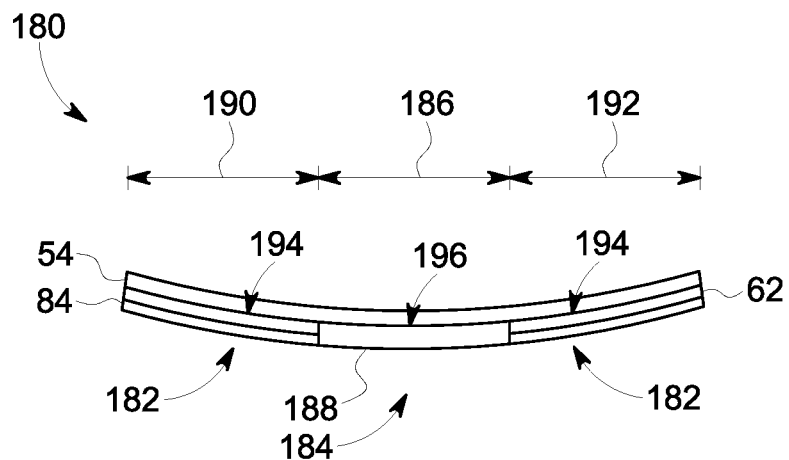
FIG. 12 is a schematic side view of a detector assembly in accordance with an alternative embodiment of the invention.

As shown in FIG. 12, detector assembly 180 is fabricated using a combination of one or more flexible detector sub-assemblies 182 and one or more rigid photodiode detector sub-assemblies 184. In one embodiment, a central portion 186 of detector assembly 180 is a conventional, rigid CT detector substrate 188 that includes a photodiode assembly formed of a rigid semiconductor material such as silicon. First and second side detector portions 190, 192 of detector assembly 180 include an organic photodiode material and may be fabricated in a similar manner as described with respect to any of detector assembly portion 94 (FIG. 6), detector assembly portion 132 (FIG. 7), detector assembly portion 136 (FIG. 8), or detector assembly portion 144 (FIG. 9), according to various embodiments. In one exemplary embodiment, first and second side detector portions 190, 192 include an organic photodiode array 62 directly deposited on a flexible substrate

84. Scintillator array 54 is then positioned atop respective top surfaces 194, 196 of organic photodiode array 62 and rigid detector substrate 188.

Figure 13:
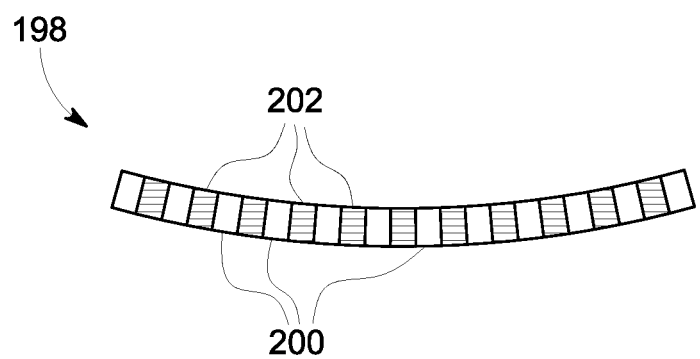
FIG. 13 is a schematic side view of a detector assembly in accordance with an alternative embodiment of the invention.

While FIG. 12 illustrates a detector assembly 180 that includes two flexible detector sub-assemblies flanking a central rigid photodiode detector sub-assembly, one skilled in the art will recognize that detector assembly 180 may be arranged using alternative combinations of flexible and rigid detector sub-assemblies based on various design specifications. For example, in one alternative embodiment shown in FIG. 13, a detector assembly 198 includes a number of individual, self-contained flexible detector modules 200 and a number of individual, self-contained rigid detector modules 202, with each flexible detector module 200 having a scintillator pack, organic photodiode array, and corresponding readout electronics similar to any of the embodiments described with respect to FIGS. 6-10. In an exemplary embodiment, each rigid detector module 202 is a conventional CT detector module that includes a multi-layer stack arranged from top to bottom with a scintillator pack, back-lit rigid silicon photodiode array, connection interposer layer, and ASIC having a solder mask layer and solder bump bond pads formed thereon. While modules 200, 202 are shown in an alternating pattern in FIG. 13, modules 200, 202 may be arranged in any number of alternative patterns, according to various embodiments.

Beneficially, embodiments of the invention replace the rigid silicon photodiode wafer typically used in detector assemblies in whole or in part with a solution-coated organic photodiode. Use of the solution-coated organic photodiode enables a direct deposition of the photodiode layer of the detector assembly onto a variety of low cost mounting substrates, including an ASIC or circuit board.

Figure 14:
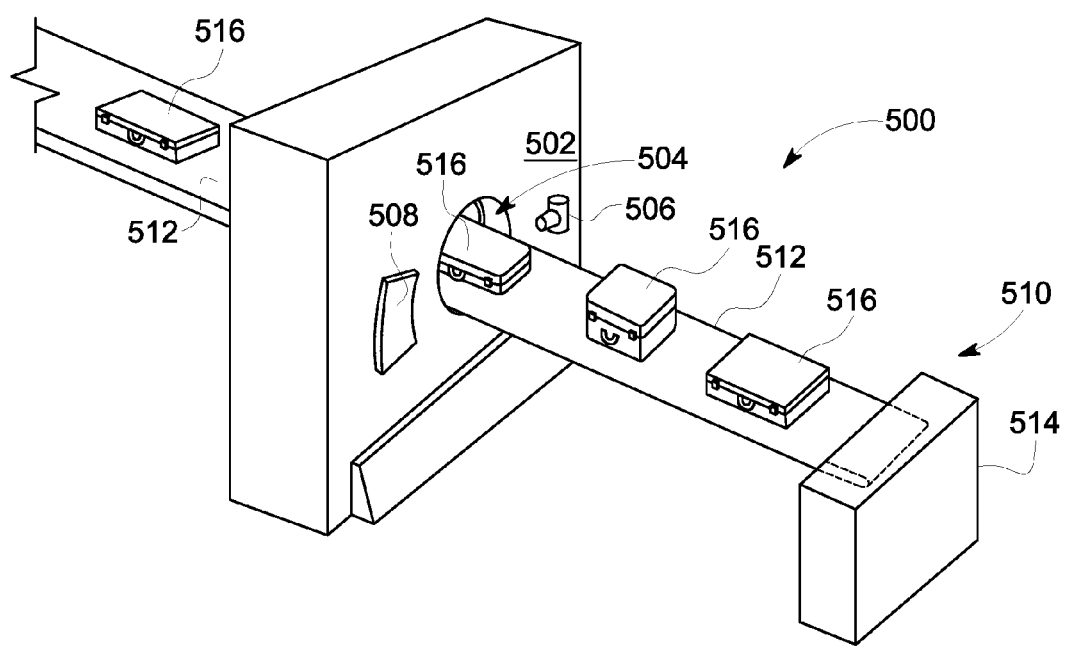
FIG. 14 is a pictorial view of a CT system for use with a non-invasive package inspection system.

Referring now to FIG. 14, package/baggage inspection system 500 includes a rotatable gantry 502 having an opening 504 therein through which packages or pieces of baggage may pass. The rotatable gantry 502 houses a high frequency electromagnetic energy source 506 as well as a detector assembly 508 having scintillator arrays comprised of scintillator cells similar to that shown in FIG. 4. A conveyor system 510 is also provided and includes a conveyor belt 512 supported by structure 514 to automatically and continuously pass packages or baggage pieces 516 through opening 504 to be scanned. Objects 516 are fed through opening 504 by conveyor belt 512, imaging data is then acquired, and the conveyor belt 512 removes the packages 516 from opening 504 in a controlled and continuous manner. As a result, postal inspectors, baggage handlers, and other security personnel may non-invasively inspect the contents of packages 516 for explosives, knives, guns, contraband, etc.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not listed may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, in accordance with one embodiment, an x-ray detector assembly includes a mounting substrate having a plurality of electrical contacts, the mounting substrate comprising one of an integrated circuit and a circuit board. The x-ray detector assembly also includes a first electrode patterned on a first portion of a top surface of the mounting substrate, wherein the first electrode is electrically coupled to the plurality of electrical contacts. An organic photodiode layer is formed atop the first electrode and has a bottom surface electrically connected to the first electrode. A second electrode is coupled to a top surface of the organic photodiode layer and a scintillator is coupled to the second electrode.

In accordance with another embodiment, a method of manufacturing an x-ray detector assembly for a computed tomography (CT) system includes providing a mounting substrate, the mounting substrate including one of an application-specific integrated circuit (ASIC) and a circuit board. The method also includes patterning a bottom electrode on a first portion of a top surface of the mounting substrate such that the bottom electrode is electrically coupled to electrical connections of the mounting substrate. Further, the method includes coating the bottom electrode with an organic photodiode solution, disposing a top electrode on the organic photodiode solution, and optically coupling a scintillator array to the top electrode.

In accordance with yet another embodiment, a computed tomography (CT) detector assembly includes a first detector sub-assembly having a rigid semiconductor photodiode substrate and a second detector sub-assembly coupled to the first detector sub-assembly. The second detector sub-assembly includes a flexible substrate layer having a plurality of electrically conductive vias formed through a thickness thereof, a first electrode having a bottom surface coupled to the plurality of conductive vias, and an organic photodiode layer having a bottom surface coupled to a top surface of the first electrode. The second detector sub-assembly also includes a second electrode having a bottom surface coupled to a top surface of the organic photodiode layer and a scintillator array coupled to a top surface of the second electrode.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An x-ray detector assembly comprising:
   a mounting substrate comprising a plurality of electrical contacts, the mounting substrate comprising one of an integrated circuit and a circuit board;
   a first electrode patterned on a first portion of a top surface of the mounting substrate, wherein the first electrode is electrically coupled to the plurality of electrical contacts;
   an organic photodiode layer formed atop the first electrode and having a bottom surface electrically connected to the first electrode;
   a second electrode coupled to a top surface of the organic photodiode layer; and
   a scintillator coupled to the second electrode;
   wherein the mounting substrate comprises a flexible substrate; and
   wherein the bottom surface of the organic photodiode layer is formed atop a second portion of the top surface of the mounting substrate.

2. The x-ray detector assembly of claim 1 further comprising a planarization layer between the mounting substrate and the organic photodiode layer, the planarization layer comprising one of polyimide, acrylate, and silicon.

3. The x-ray detector assembly of claim 1 further comprising a solder mask layer provided between the mounting substrate and the organic photodiode layer.

4. The x-ray detector assembly of claim 1 wherein the mounting substrate comprises an FR-4 substrate.

5. The x-ray detector assembly of claim 4 further comprising an application-specific integrated circuit (ASIC) coupled to a bottom surface of the mounting substrate.

6. The x-ray detector assembly of claim 1 wherein the mounting substrate comprises an ASIC.

7. The x-ray detector assembly of claim 1 wherein the second electrode comprises a transparent, unpatterned layer.

8. The x-ray detector assembly of claim 1 wherein the organic photodiode layer comprises a donor material and an acceptor material;
   wherein the donor material comprises a low bandgap polymer; and
   wherein the acceptor material comprises a fullerene material.

9. The x-ray detector assembly of claim 8 wherein the donor material has a highest occupied molecular orbital (HOMO) greater than or equal to 4.9 eV.

10. The x-ray detector assembly of claim 8 wherein the fullerene material comprises a phenyl-$C_{61}$-butyric acid methyl ester (PCBM) material.

11. A method of manufacturing an x-ray detector assembly for a computed tomography (CT) system comprising:
    providing a mounting substrate, the mounting substrate comprising one of an application-specific integrated circuit (ASIC) and a circuit board;
    patterning a bottom electrode on a first portion of a top surface of the mounting substrate such that the bottom electrode is electrically coupled to electrical connections of the mounting substrate;
    coating the bottom electrode with an organic photodiode solution;
    coating a second portion of the top surface of the mounting substrate with the organic photodiode solution;
    disposing a top electrode on the organic photodiode solution; and
    optically coupling a scintillator array to the top electrode.

12. The method of claim 11 further comprising:
    depositing a smoothing layer on the mounting substrate prior to patterning the bottom electrode;
    forming a pattern of vias through the smoothing layer, the pattern of vias aligned with the electrical connections of the mounting substrate; and
    patterning the bottom electrode on a top surface of the smoothing layer and through the plurality of vias.

13. The method of claim 12 further comprising mixing a low bandgap polymer, a fullerene material, and a solvent to form the organic photodiode solution.

14. The method of claim 11 further comprising:
    disposing the top electrode in a continuous layer coating a top surface of the organic photodiode solution; and
    patterning the bottom electrode to form a plurality of detector pixels.

15. A computed tomography (CT) detector assembly comprising:
    a first detector sub-assembly comprising a rigid semiconductor photodiode substrate; and
    a second detector sub-assembly coupled to the first detector sub-assembly, the second detector sub-assembly comprising:
       a flexible substrate layer having a plurality of electrically conductive vias formed through a thickness thereof;
       a first electrode having a bottom surface coupled to the plurality of conductive vias;
       an organic photodiode layer having a bottom surface coupled to a top surface of the first electrode;
       a second electrode having a bottom surface coupled to a top surface of the organic photodiode layer; and
       a scintillator array coupled to a top surface of the second electrode;
    wherein the bottom surface of the organic photodiode layer coats a first portion of a top surface of the flexible substrate layer and a top surface of the first electrode; and
    wherein a portion of the bottom surface of the first electrode is coupled to a second portion of the top surface of the flexible substrate layer.

16. The CT detector assembly of claim 15 wherein second detector sub-assembly further comprises:
    a first detector section coupled to a first side of the first detector sub-assembly; and
    a second detector section coupled to a second side of the first detector sub-assembly.

17. The CT detector assembly of claim 15 further comprising at least one of a wherein the top electrode comprises a transparent, unpatterned layer.

18. The CT detector assembly of claim 15 wherein the organic photodiode layer comprises:
    a donor material comprising a low bandgap polymer; and
    an acceptor material comprising a fullerene material.

19. The CT detector assembly of claim 15 further comprising an application specific integrated circuit (ASIC) coupled to a bottom surface of the flexible substrate layer.

* * * * *